United States Patent [19]

Bae

[11] Patent Number: 5,498,449
[45] Date of Patent: Mar. 12, 1996

[54] PHOTORESIST FILM COATING METHOD

[75] Inventor: Sang M. Bae, Ichon, Rep. of Korea

[73] Assignee: Hyundai Electronics Industries Co., Ltd., Kyoungki, Rep. of Korea

[21] Appl. No.: 382,756

[22] Filed: Feb. 2, 1995

[30] Foreign Application Priority Data

Feb. 3, 1994 [KR] Rep. of Korea .................. 94-1941

[51] Int. Cl.$^6$ .......................................... G05D 3/12
[52] U.S. Cl. ................. 427/240; 427/385.5; 437/231
[58] Field of Search ................... 427/385.5, 240; 437/231

[56] References Cited

U.S. PATENT DOCUMENTS 3,795,534  3/1974  MeBalso .................. 427/240

FOREIGN PATENT DOCUMENTS 54-0001603  8/1979  Japan .................. 427/240

*Primary Examiner*—Janyce Bell
*Attorney, Agent, or Firm*—Popham, Haik, Schnobrich & Kaufman, Ltd.

[57] ABSTRACT

There is disclosed a method for the formation of photoresist film. The photoresist film of a semiconductor is formed by a method consisting broadly of: feeding a photoresist solution onto a rugged surface of a wafer which is rotated at a low speed, to form a photoresist film with a smooth surface; turning the wafer right over, to make the photoresist film of smooth surface look downward; and rotating the wafer at a high speed. The formed photoresist film becomes rugged along the topology of the wafer, resulting in close similarity in the thickness of the photoresist film. Owing to this similarity, the light absorptivity is almost identical all over the present photoresist film, so that advantages are effected such as an increase in the reliability and production yield of highly integrated semiconductor device.

3 Claims, 1 Drawing Sheet

PHOTORESIST FILM COATING METHOD

BACKGROUND OF THE INVENTION

1. Field of the Invention

The present invention relates, in general, to a method for coating a photoresist film useful in the fabrication of a semiconductor device and, more particularly, to a photoresist film which has a uniform thickness, thereby improving the production yield and reliability of a semiconductor device.

2. Description of the Prior Art

High integration of a semiconductor device is greatly indebted to the development of processes for forming fine patterns. In particular, photoresist film patterns formed by lithography processes are extensively used as masks for etch or ion-implantation processes in the fabrication processes of semiconductor devices. Accordingly, for better photolithography, fine patterning of photoresist film, security of processing and clear removal of the photoresist film pattern are necessary. In addition, when a photoresist film pattern is incorrectly formed, re-establishment of the photoresist film pattern should be accomplished with ease.

A typical photoresist film pattern is formed by a method consisting broadly of: mounting a wafer on a spinner; feeding a photoresist solution comprising photoresist agent and resin onto the wafer; rotating the spinner in high speeds, to form a uniform coating of the photoresist solution on the wafer; illuminating a beam of light on the photoresist coating by use of an exposure mask having a light screen pattern, to polymerize the photoresist coating; and developing the illuminated photoresist coating, to remove the unilluminated areas of the coating.

In order to better understand the background of the present invention, conventional techniques for forming photoresist film will be described with reference to FIG. 1.

Referring to FIG. 1, there is illustrated a prior technique for forming a photoresist film on a very rugged surface of a wafer. On a spinner 10 is mounted a wafer 11 on which insulation film patterns 13 capped with conductive wiring 15 are covered with a blanket interlayer insulation film 17 of oxide or nitride, as shown in FIG. 1. As a result, there are many prominence and depression parts on the wafer 11. While the spinner 10 is rotated at a high speed, a negative or positive photoresist solution is fed onto the wafer 11, to form a photoresist film 19 of smooth surface. Accordingly, the photoresist film 19 is relatively thick (with a thickness of $t_1$) at the prominence parts attributable to the conductive wirings 15. On the other hand, the photoresist film 19 is relatively thin (with a thickness of $t_2$) at the depression parts, as shown in FIG. 1. By reference, the higher is the degree of integration of a semiconductor device, the more rugged the surface of the wafer 11 is by such patterns as the conductive wirings 15.

When the photoresist film formed by the prior technique, of which the thickness is different from one portion to another on a wafer, is illuminated with a beam of light, the energy absorbed by the photoresist film is not uniform by its portions because of its different thickness. Therefore, the finished photoresist film patterns are different in size from one another, leading to a decrease in the uniformity of critical dimension.

As mentioned previously, the photoresist film of a semiconductor device according to the prior technique has different thicknesses due to intense ruggedness or topology change of a substructure, resulting in a difference in absorption energy of light. Accordingly, since the final patterns are not similar to one another, the production yield and the reliability of a semiconductor device are lowered.

SUMMARY OF THE INVENTION

Therefore, an object of the present invention is to overcome the problems encountered in the prior art and to provide a method for forming a photoresist film having almost the same thickness at all portions thereof.

In accordance with the present invention, the above object can be accomplished by providing a method for the formation of photoresist film, comprising the steps of: feeding a photoresist solution onto a rugged surface of a wafer, to form a photoresist coating with a smooth surface; turning the wafer right over, to make the photoresist film of smooth surface look downward; and rotating the wafer at a high speed, to form a photoresist film with a rugged surface along the topology of the wafer, whereby the thickness of the photoresist film can become almost the same at all positions.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE PREFERRED EMBODIMENTS

Figure 2:
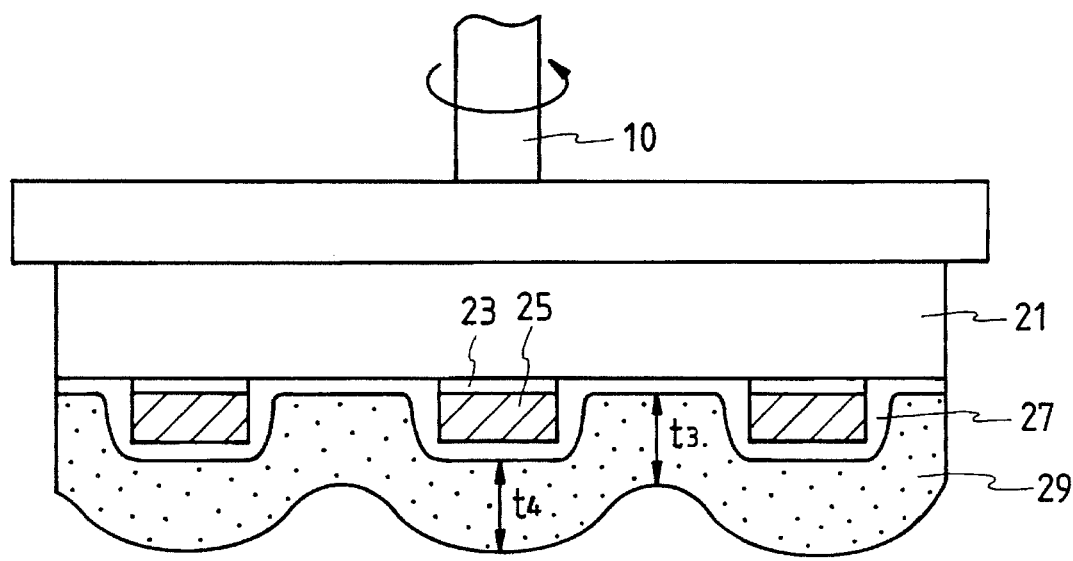
FIG. 2 is a schematic cross sectional view illustrating a method for the formation of photoresist film, according to the present invention.

The application of the preferred embodiments of the present invention is best understood with reference to FIG. 2.

Referring to FIG. 2, there is illustrated a preferred method for coating a photoresist film of a semiconductor device. As shown in this figure, there is a wafer 21 on which insulation film patterns 23 capped with conductive wiring 25 are covered with a blanket interlayer insulation film 27 of oxide or nitride. As a result, there are many prominence and depression parts on the wafer 21, attributable to, inter alia, the conductive wirings 25. As previously mentioned, the prominence and depression become more serious as the degree of integration of a semiconductor device increases.

Figure 1:
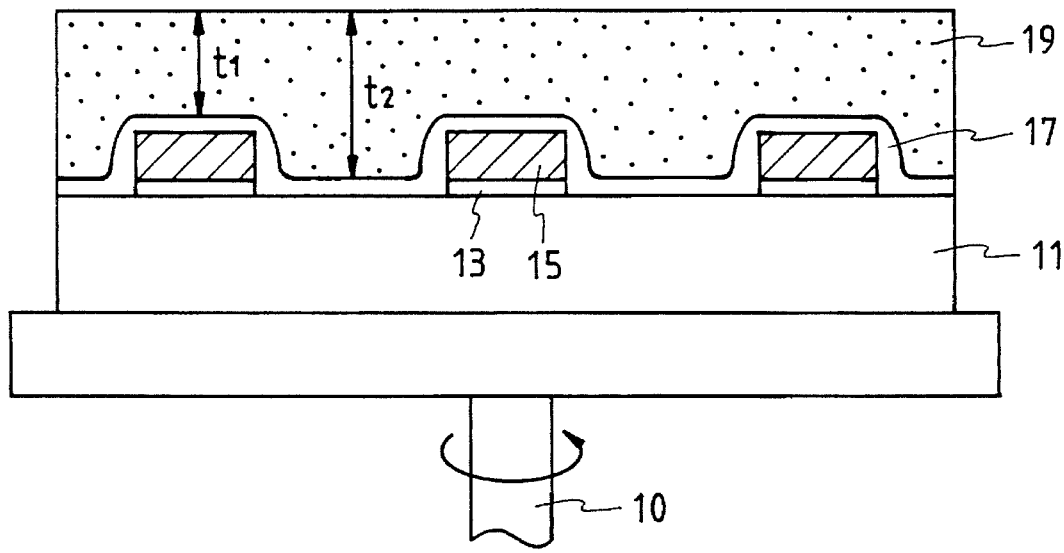
FIG. 1 is a schematic cross sectional view illustrating a prior technique for the formation of photoresist film.

Primarily, the wafer 21 is mounted on a spinner 10 in such a way that the wafer 21 looks upward. While the spinner 10 is rotated at a low speed, for example, 500 rpm, a negative or positive photoresist solution is fed onto the wafer 21, to form a photoresist film 29. This photoresist film 29 comes to have a smooth surface, as shown in FIG. 1. That is, it is relatively thick at the prominence parts of the conductive wirings 25 and relatively thin at the depression parts.

Thereafter, the rotating axis of the spinner 10 is turned over in such a way that the wafer 21 looks downward and then, rotated at a high speed. As a result, the photoresist film 29 becomes rugged along the topology of the interlayer insulation film 27.

Speaking with more detail, the photoresist film 29 with smooth surface is protruded at the prominence parts and sunk at the depression parts by the action of gravity and rotation because it is of fluidity. Therefore, ruggedness is generated at the surface of the photoresist film 29, such that the thickness $t_4$ of the photoresist film 29 over the conductive wirings 25 is very similar to that of $t_3$ over the depression parts. By virtue of this uniform thickness of the photoresist film over wafer, the light absorptivity is almost identical all over the photoresist film when it is illuminated with a beam of light and the uniformity of critical dimension is increased.

As described hereinbefore, a photoresist film of a semiconductor is formed by a method consisting broadly of: feeding a photoresist solution onto a rugged surface of a wafer which is rotated at a low speed, to form a photoresist film with a smooth surface; turning the wafer right over, to make the photoresist film of smooth surface look downward; and rotating the wafer at a high speed. The formed photoresist film becomes rugged along the topology of the wafer, resulting in close similarity in the thickness of the photoresist film. Owing to this similarity, the light absorptivity is almost identical all over the present photoresist film, so that advantages are effected such as an increase in the reliability and production yield of highly integrated semiconductor devices.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for the formation of photoresist film, comprising the steps of:

feeding a photoresist solution onto a rugged surface of a wafer, to form a photoresist coating having a smooth surface;

turning the wafer over, so that the photoresist film having a smooth surface faces downward; and rotating the wafer to form a photoresist film having a rugged surface along the topology of the wafer by the action of gravity and rotation so that the thickness of the photoresist film can become almost the same at all positions.

2. A method in accordance with claim 1, wherein said wafer has a topology on its surface on which a plurality of multilayer patterns is formed.

3. A method in accordance with claim 1, wherein said wafer is rotated while said photoresist coating is fed onto said wafer.

\* \* \* \* \*